United States Patent
Chen

(10) Patent No.: US 6,271,654 B1
(45) Date of Patent: Aug. 7, 2001

(54) MULTIFUNCTIONAL METER WITH DUAL INPUT CHANNELS

(76) Inventor: Lee-Fei Chen, 5 Fl., No. 30, Sec. 2, Hsin-I Rd., Taipei (TW)

(*) Notice: Subject to any disclaimer, the term of this patent is extended or adjusted under 35 U.S.C. 154(b) by 0 days.

(21) Appl. No.: 09/441,120

(22) Filed: Nov. 17, 1999

(51) Int. Cl.[7] .......................... G08B 21/00; G01R 23/16
(52) U.S. Cl. ............................................ 324/115; 324/142
(58) Field of Search .................................. 324/115, 110, 324/142

(56) References Cited

U.S. PATENT DOCUMENTS

| | | | |
|---|---|---|---|
| 2,509,415 | * 5/1950 | Bernreuter | 342/115 |
| 2,732,491 | * 1/1956 | Jeannot | 455/226.4 |
| 4,825,392 | * 4/1989 | Freeman | 324/142 |
| 5,243,275 | * 9/1993 | Nakazawa et al. | 324/110 |
| 5,619,129 | * 4/1997 | Kamiya | 324/115 |

FOREIGN PATENT DOCUMENTS

0416731A2 * 11/1991 (EP).

* cited by examiner

*Primary Examiner*—Safet Metjahic
*Assistant Examiner*—Vincent Q. Nguyen
(74) *Attorney, Agent, or Firm*—William E. Pelton, Esq.

(57) ABSTRACT

A multifunctional meter with two pairs of input channels is disclosed. The meter has a function key disposed thereon for a user to select and set various functions. A first input channel and a second input channel are respectively formed on the meter by two sets of positive probe sockets and negative probe sockets for sequentially receiving two sets of measured values. A processing unit is disposed within the meter and connected with a display of the meter for selectively display, storage and/or calculation of the two sets of measured values. With this arrangement, convenient electrical measurement can be attained without removal of the probes and change of objects in the case of two objects to be measured.

9 Claims, 15 Drawing Sheets

MULTIFUNCTIONAL METER WITH DUAL INPUT CHANNELS

FIELD OF THE INVENTION

The present invention relates to a multifunctional meter with dual input channels, and more particularly to an meter which is able to not only display two sets of measured values, but also calculate the measured values in the case of two objects to be measured.

DESCRIPTION OF RELATED ART

As well-known, a multifunctional meter is an important measuring tool in the electrical field. It is commonly used to measure DC current, voltage, resistance, capacity, and polarity of a semi-conductor element. A conventional meter generally has a single input channel formed by a positive probe and a negative probe, that is, only one object can be measured and displayed during each operation. In the case that there is more than one object to be measured at the same time, the probes have to be removed from one object to the other. Furthermore, the measured values of each operation have to be manually recorded for further calculation. As a result, it is an aim of the present invention to set the above-mentioned problems aside and to provide an improved meter which is able to measure more than one object during one operation and provide display, storage and calculation functions to the measured values.

SUMMARY OF THE INVENTION

In accordance with one aspect of the present invention, a multifunctional meter with dual input channels comprises a display disposed on a panel thereof, and a function key arranged on the panel for a user to select and set various functions. A first multiple selecting unit and a second multiple selecting unit respectively are connected and controlled by a first knob and a second knob through a plurality of contact points within the meter. The meter further includes a large-current probe socket, a pair of positive probe sockets and a negative (ground) probe socket. The negative probe socket is commonly used with the pair of positive probe sockets. The first positive probe socket and the negative probe socket form a first input channel and the second positive probe socket and the negative probe socket form a second input channel. The first and second input channels are respectively connected with the first multiple selecting unit and the second multiple selecting unit. Additionally, a processing unit is arranged within the meter and connected with the display, the function key, and the first and second multiple selecting units for selective display, storage and/or calculation of two sets of measured values obtained by the first and second input channels.

In accordance with another aspect of the present invention, a multifunctional meter with dual input channels comprises a display disposed on a panel thereof and a function key arranged on the panel for a user to select and set various functions. A first multiple selecting unit and a second multiple selecting unit are respectively connected and controlled by a first knob and a second knob through a plurality of contact points within the meter. The meter further has a large-current probe socket, a pair of positive probe sockets and first and second negative (ground) probe sockets respectively arranged on the meter. The first positive probe socket and the first negative probe socket form a first input channel. The second positive probe socket and the second negative probe socket form a second input channel. The first and second input channels are respectively connected with the first multiple selecting unit and the second multiple selecting unit. Additionally, a processing unit is arranged within the meter, connected with the display, the function key, and the first and second multiple selecting units for selective display, storage and/or calculation of two sets of measured values obtained by the first and second input channels.

BRIEF DESCRIPTION OF THE DRAWINGS

The invention will now be described in detail at the background of embodiments and with reference to the accompanied drawings, wherein.

DETAIL DESCRIPTION OF THE PREFERRED EMBODIMENT

Figure 1:
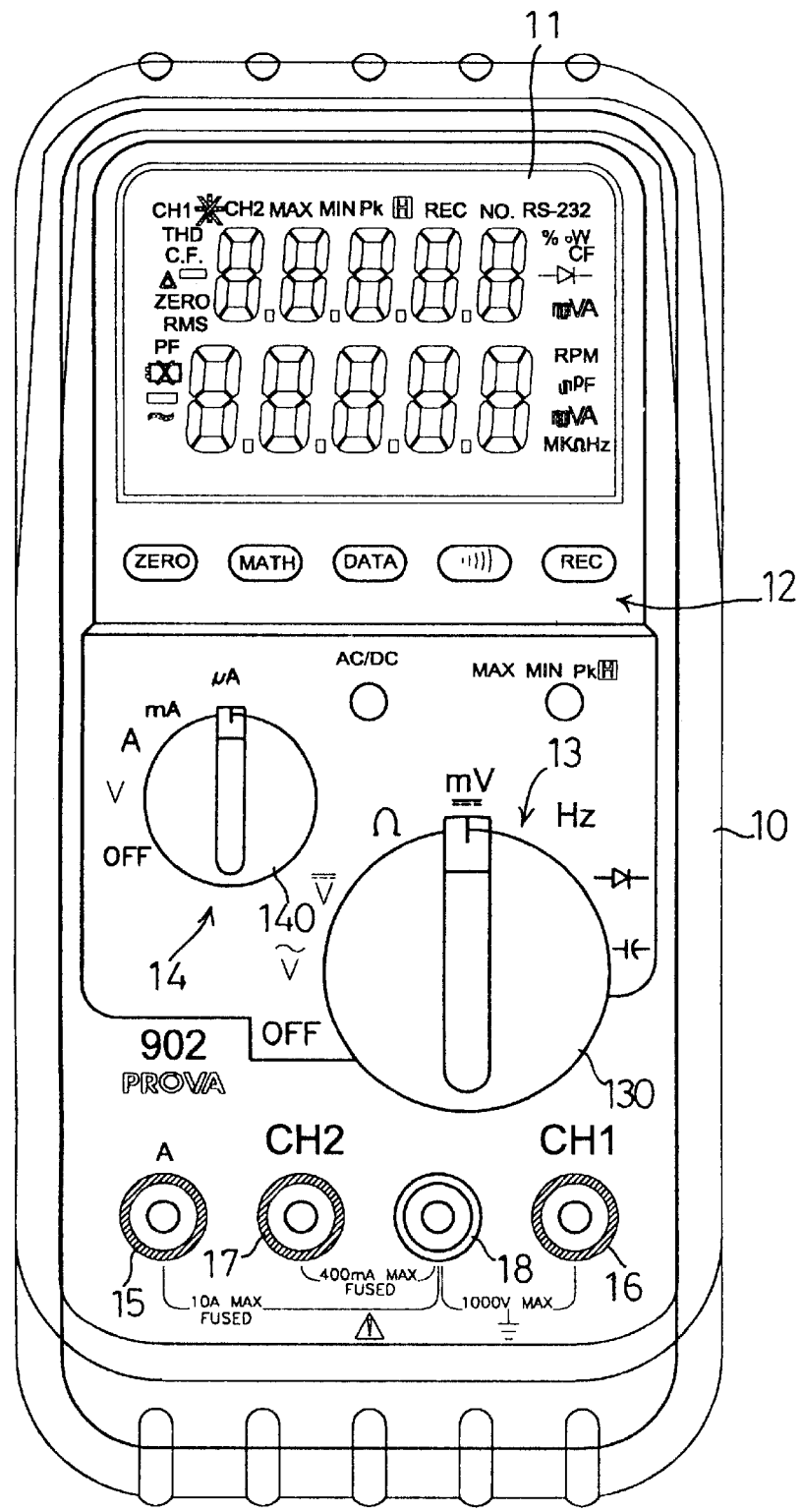
FIG. 1 is a perspective view of a first preferred embodiment of an meter of the present invention.

Referring to FIG. 1, a multifunctional meter (10) in accordance with the present invention has a body with a similar structure as a conventional meter. The meter (10) of the invention comprises a display (11) on a surface thereof for displaying various sets and measured values, such as voltage, current and resistance. A function key (12) is disposed below the display (11) for a user to select and set various functions, including zero (ZERO), mathematics (MATH), data (DATA), alarm (ALARM), record (REC), switching AC/DC (AC/DC), and locking maximum and minimum values (MAX/MIN PK).

The meter (10) further has a first multiple selecting unit (13) and a second multiple selecting unit (14) respectively arranged below the function key (12). The first and second multiple selecting units (13,14) are respectively connected and controlled by a first and a second knob (130, 140) through a plurality of contact points (not shown) arranged within the meter (10).

In addition, the meter (10) includes a large-current probe socket (15), a pair of positive probe sockets (16, 17), and a negative (ground) probe socket (18). In a preferred embodiment, the negative probe socket (18) is commonly used with the pair of positive probe sockets (16, 17), that is, each of the positive probe sockets (16,17) has the same reference voltage. A first input channel CH1 is formed by the first positive probe socket (16) and the negative probe socket (18) and similarly, a second input channel CH2 is formed by the second positive probe socket (17) and the negative probe socket (18). With the sequential operation of the first multiple selecting unit (13) and the second multiple selecting unit (14), the first input channel CH1 and the second input channel CH2 can be used for measuring two sets of objects without removal of the probes and change of the objects. With this arrangement, the meter (10) further can display, store and/or calculate the two sets of measured values at the same time through an internal process unit which will be described in detail later.

Figure 2:
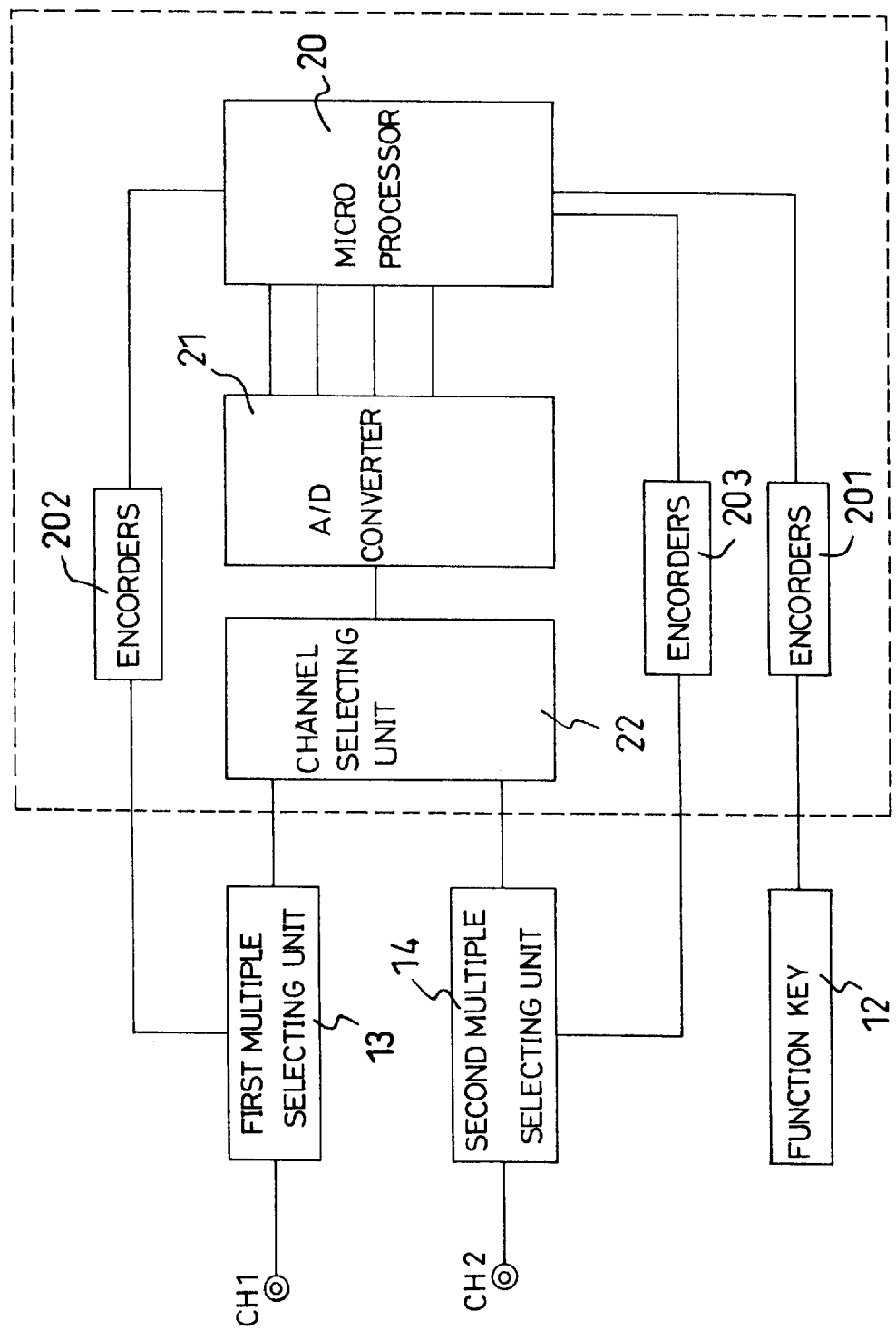
FIG. 2 is a block diagram of the first embodiment of FIG. 1, showing the structure of a processing unit of the meter.
Figure 3A:
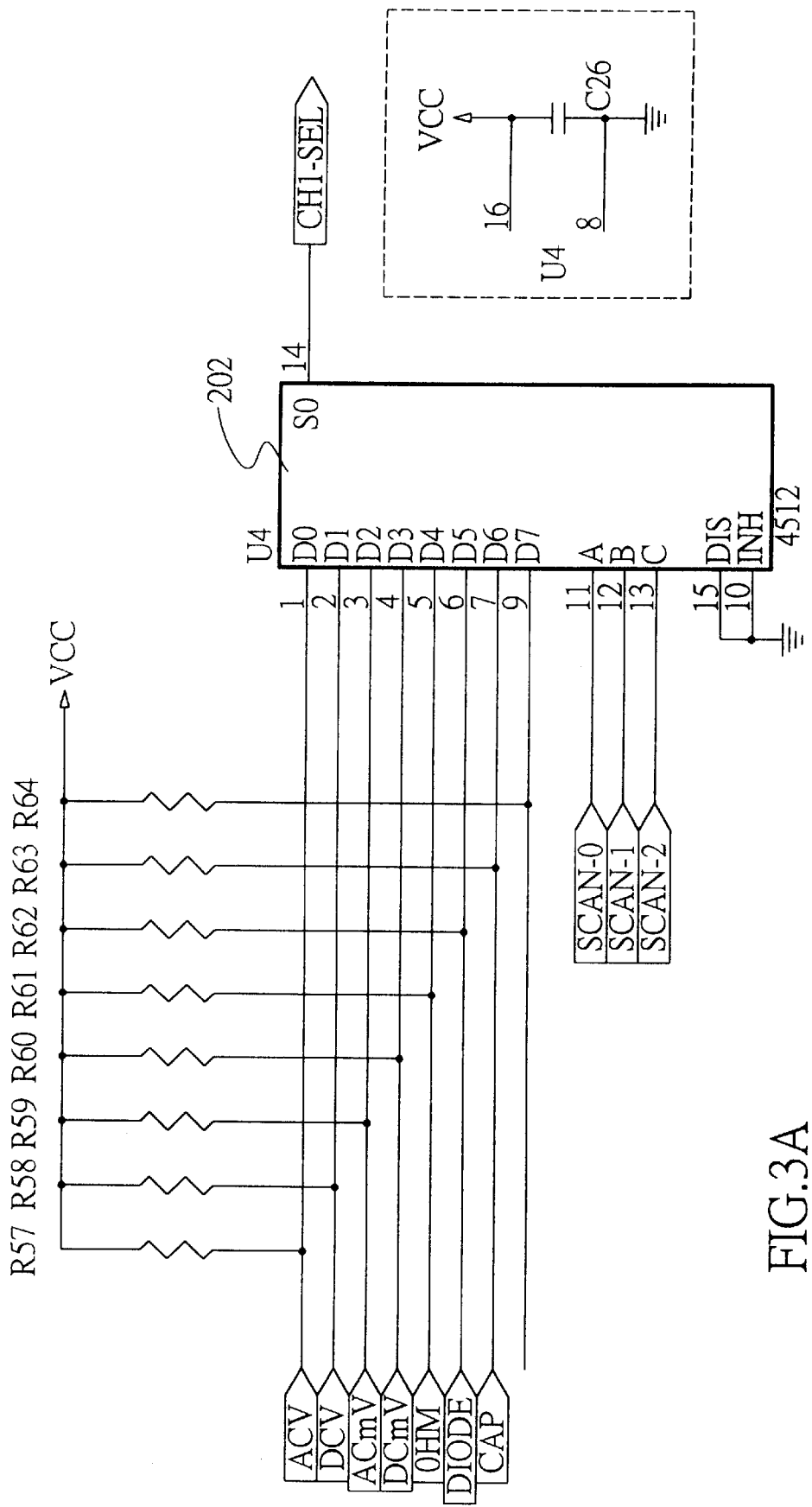
FIGS. 3A to 3G show a first circuit layout of the processing unit of the meter of FIG. 2.
Figure 3B:
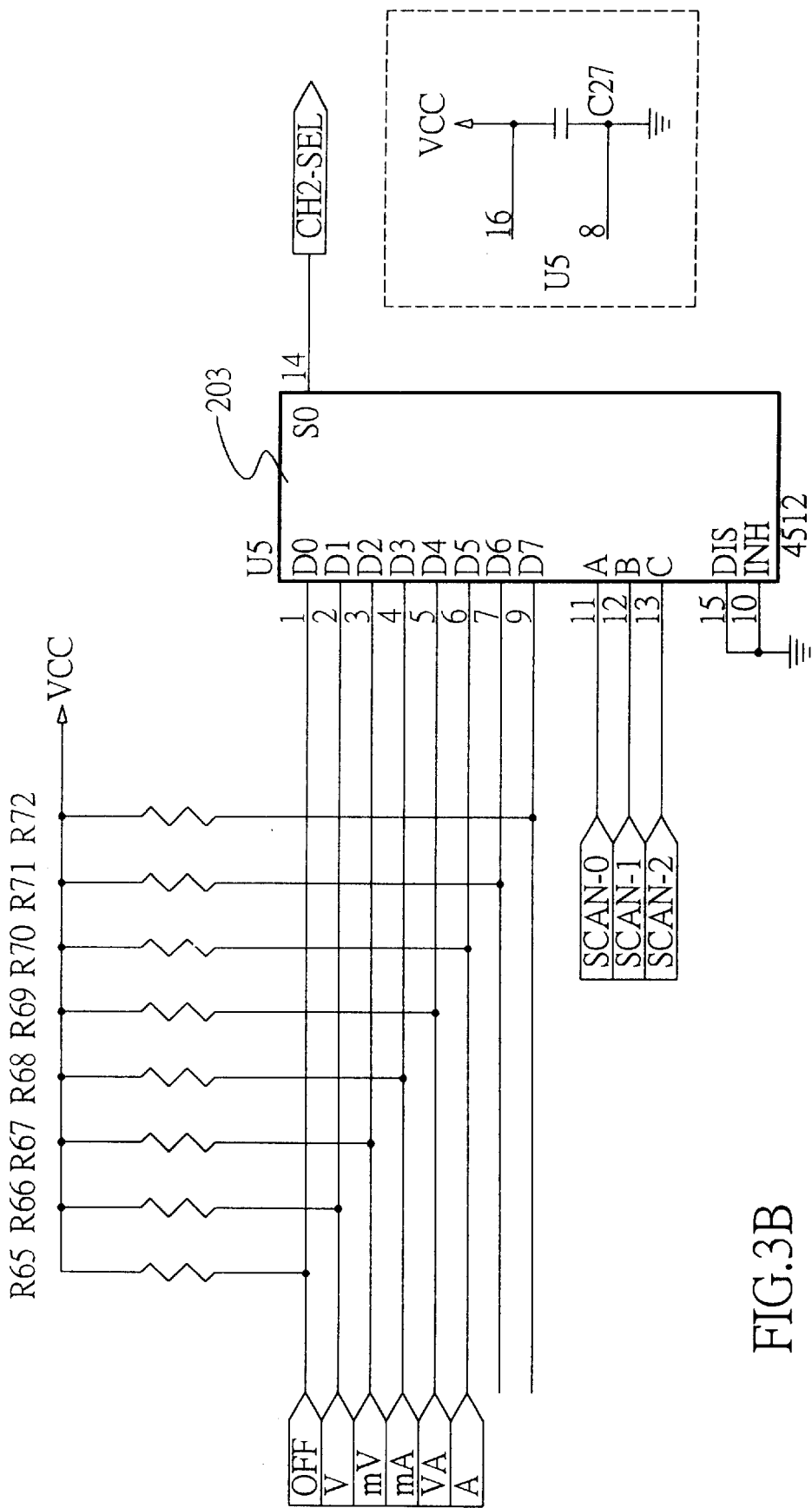
Figure 3C:
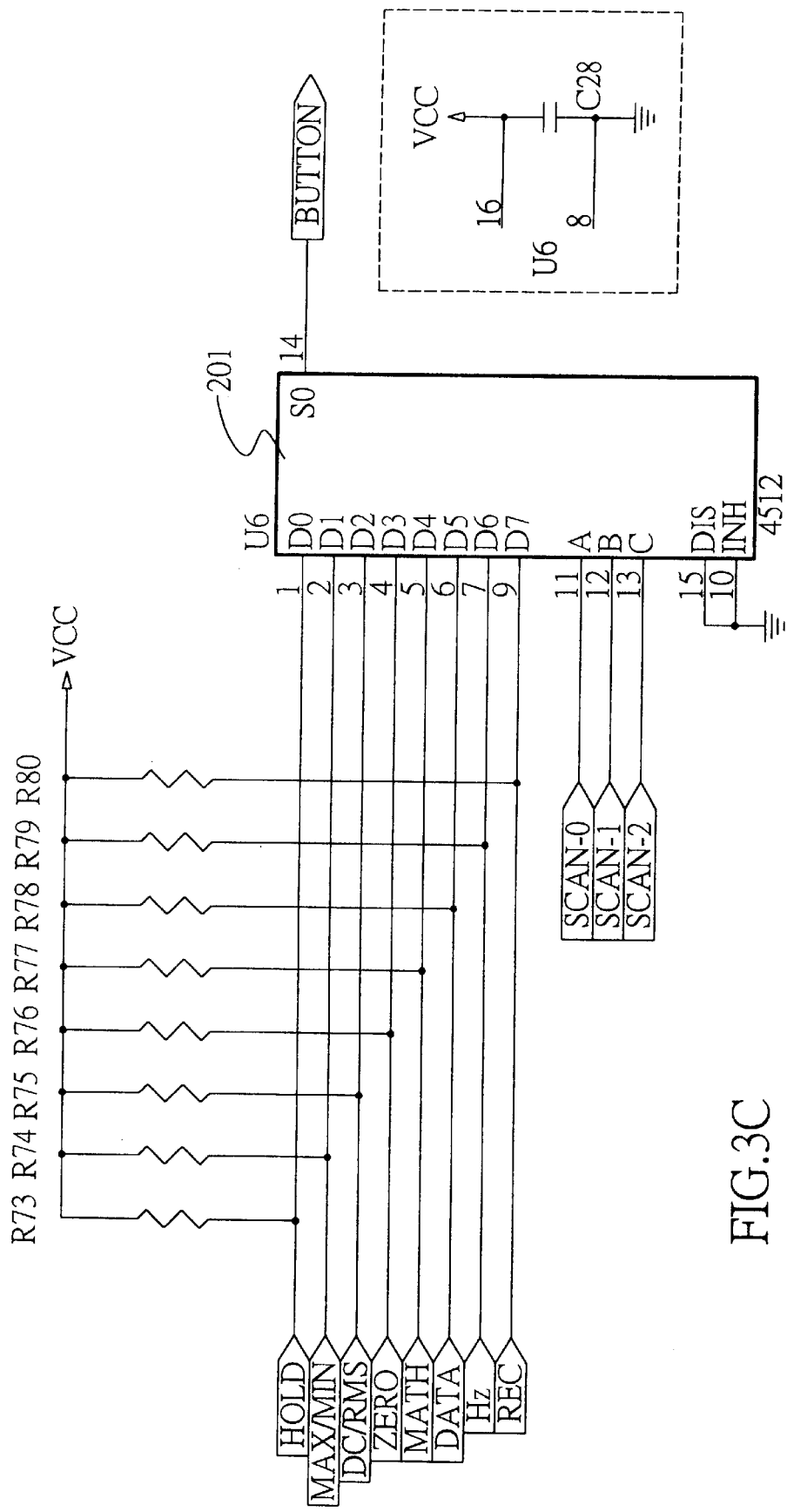
Figure 3D:
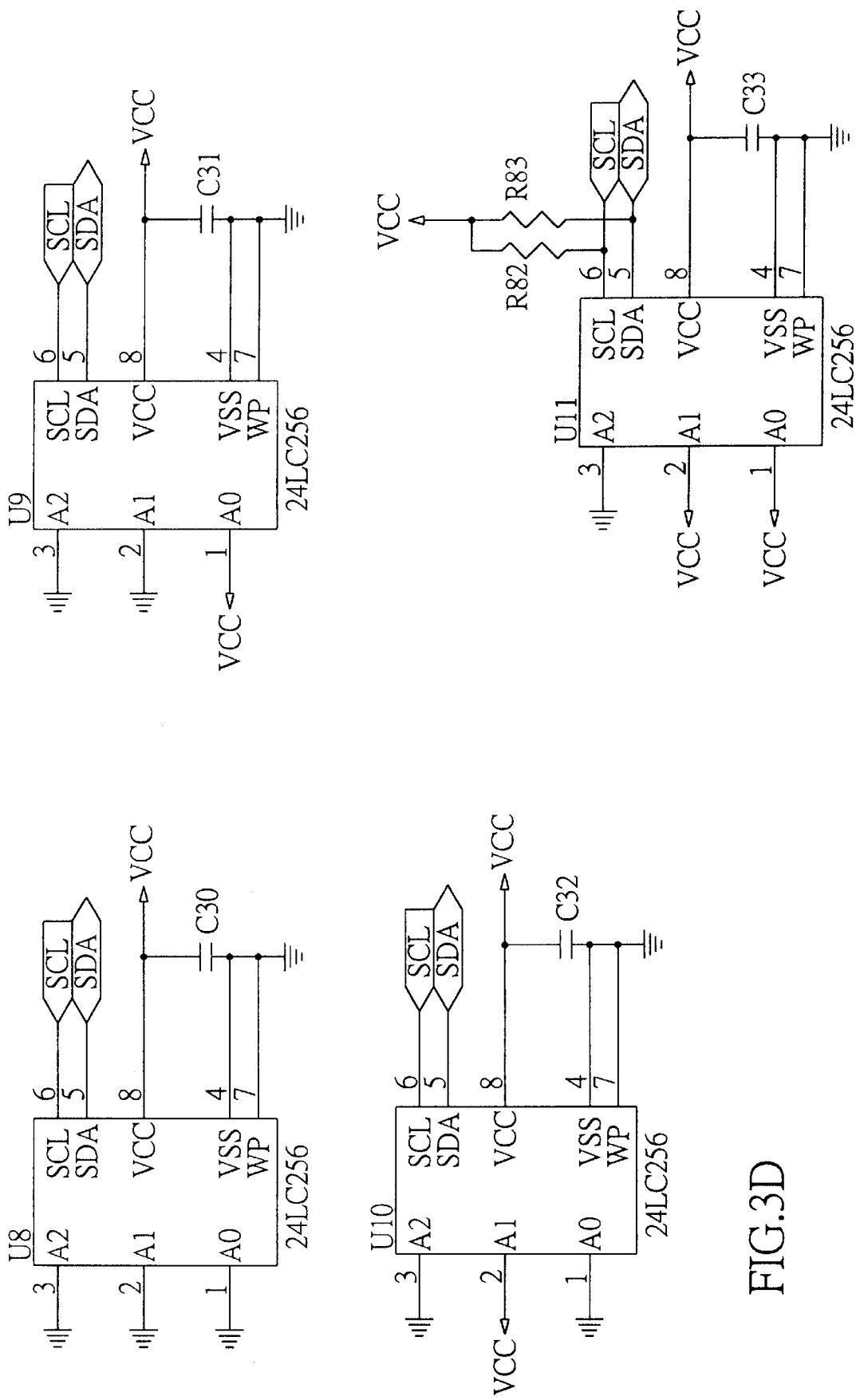
Figure 3E:
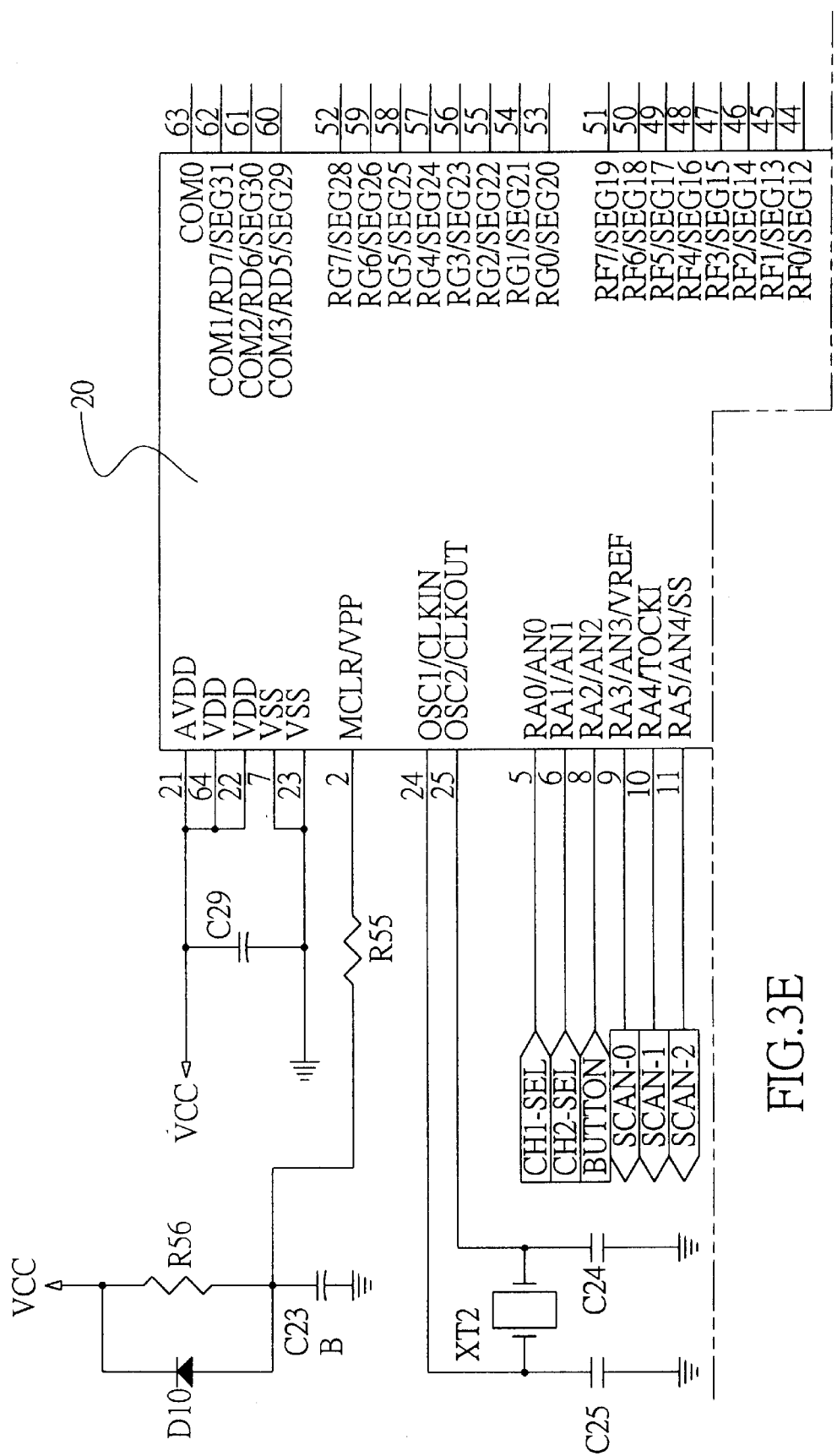
Figure 3F:
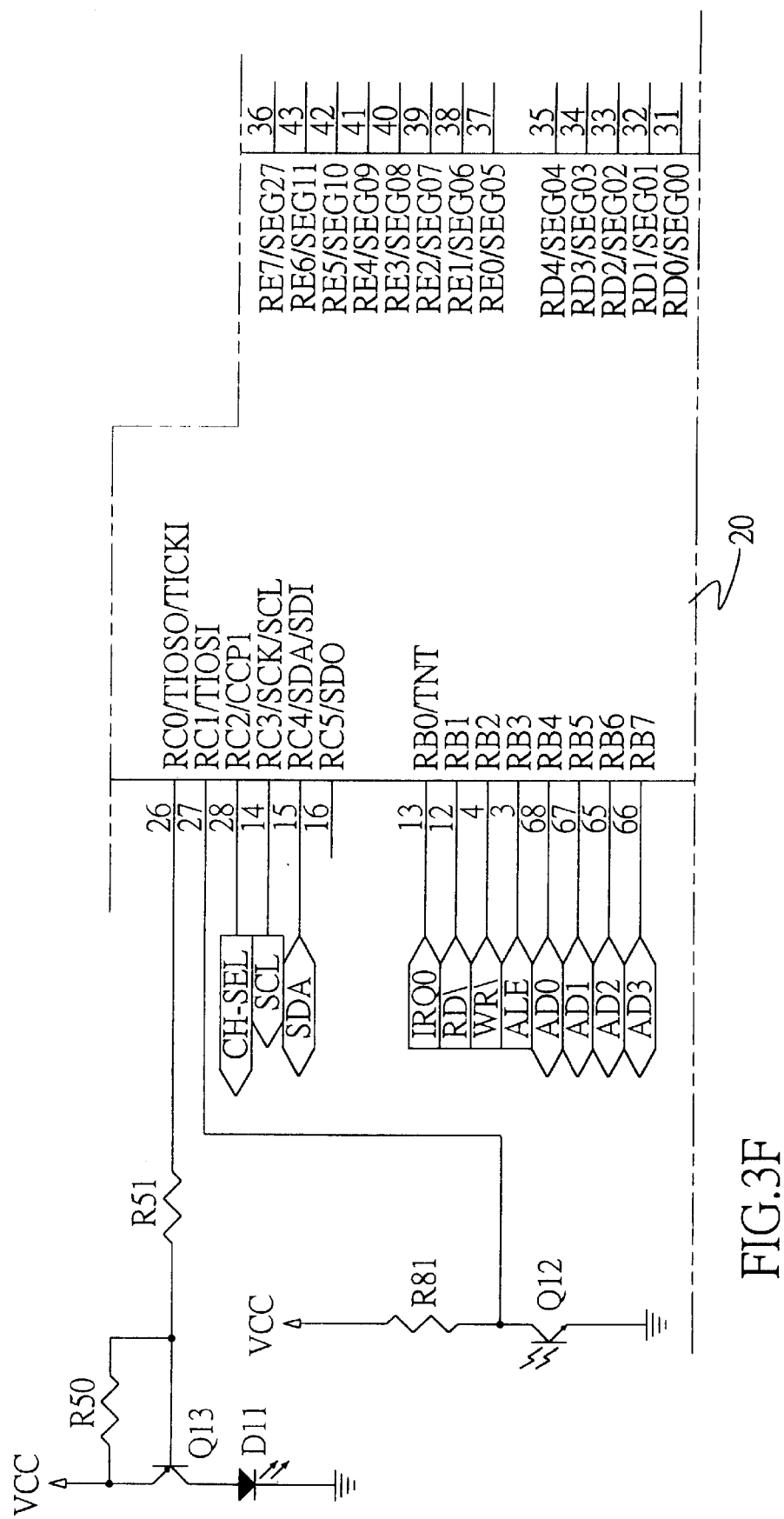
Figure 3G:
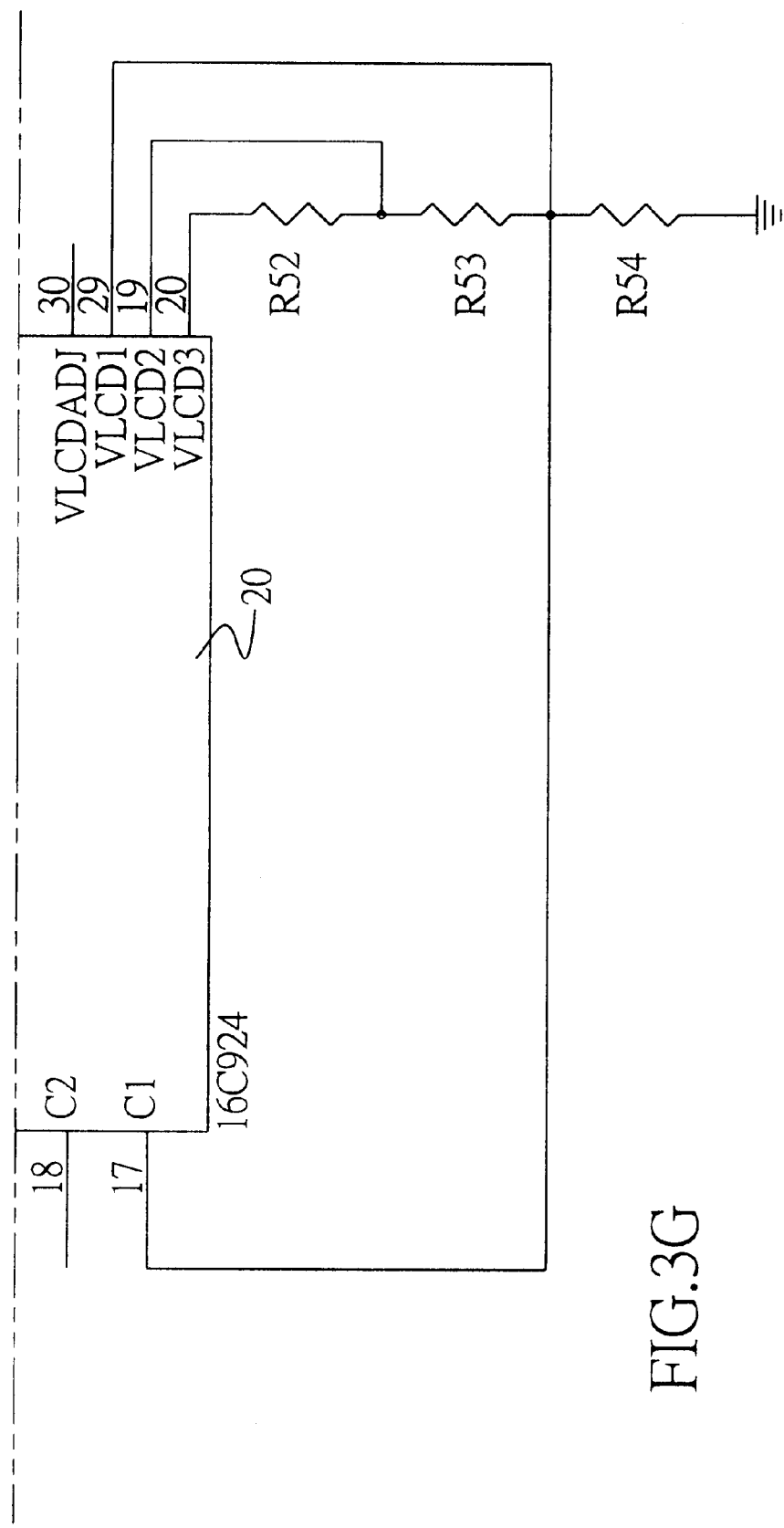
Figure 4A:
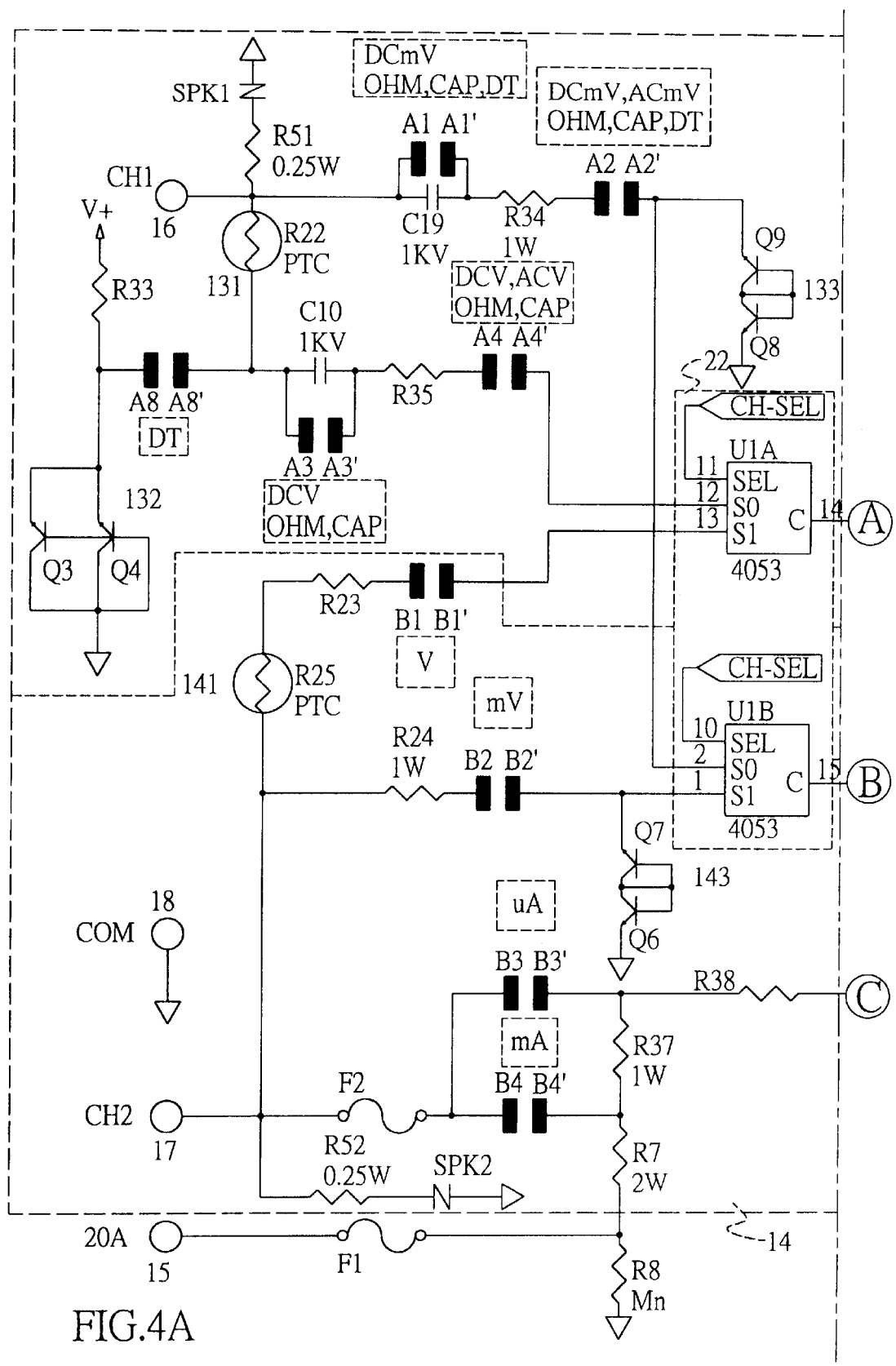
FIGS. 4A to 4D show a second circuit diagram of the processing unit of the meter of FIG. 2.
Figure 4B:
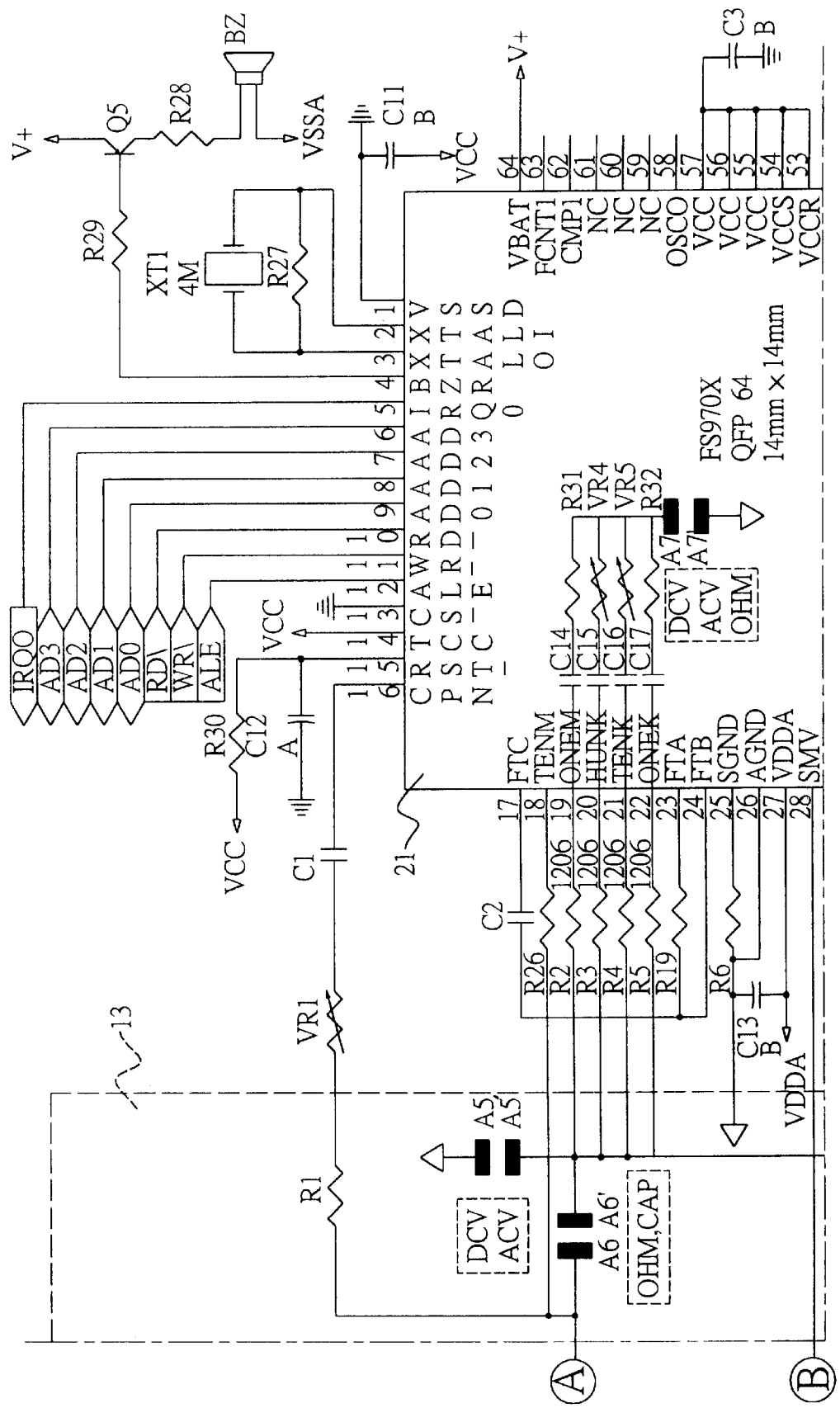
Figure 4C:
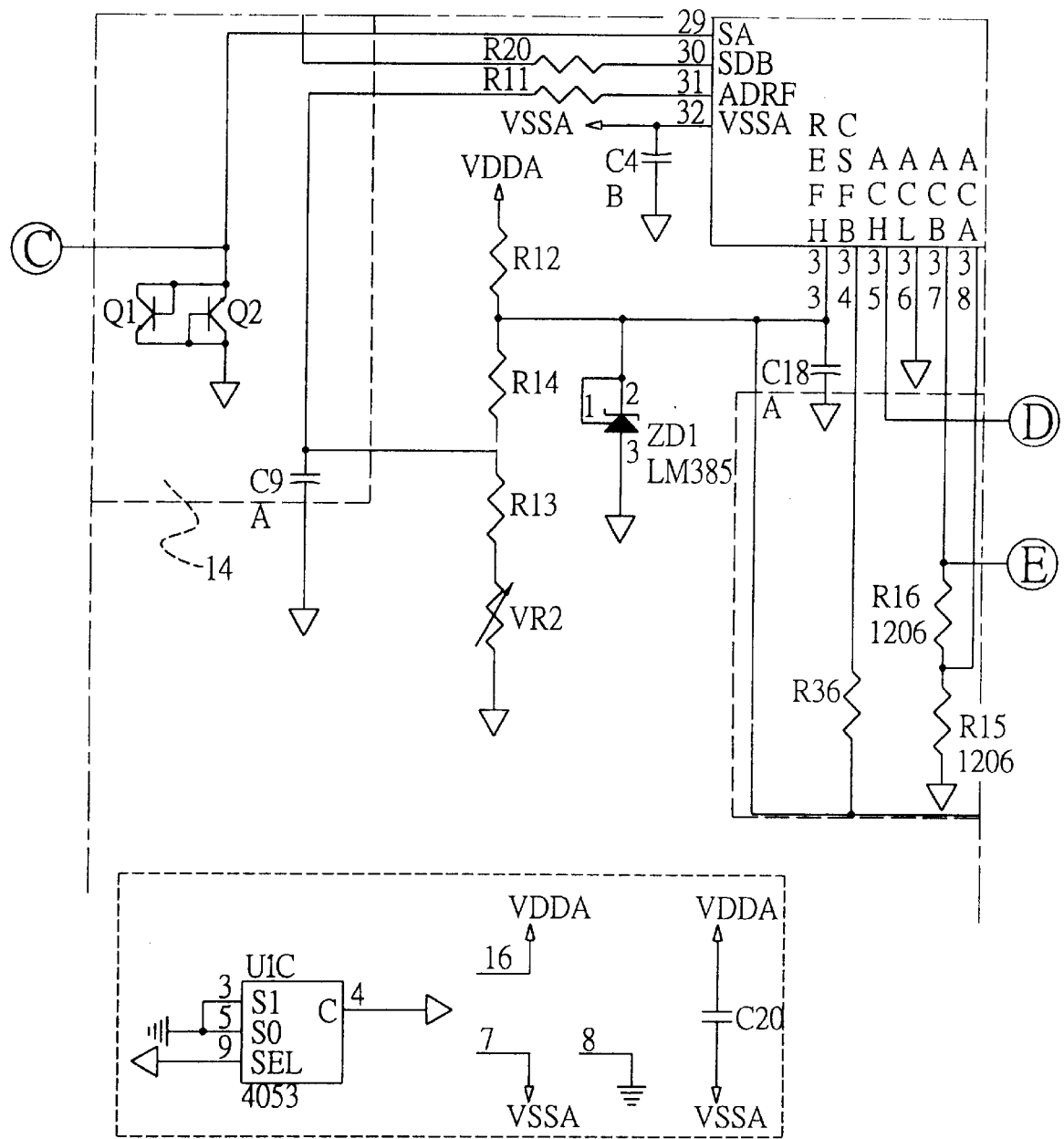
Figure 4D:
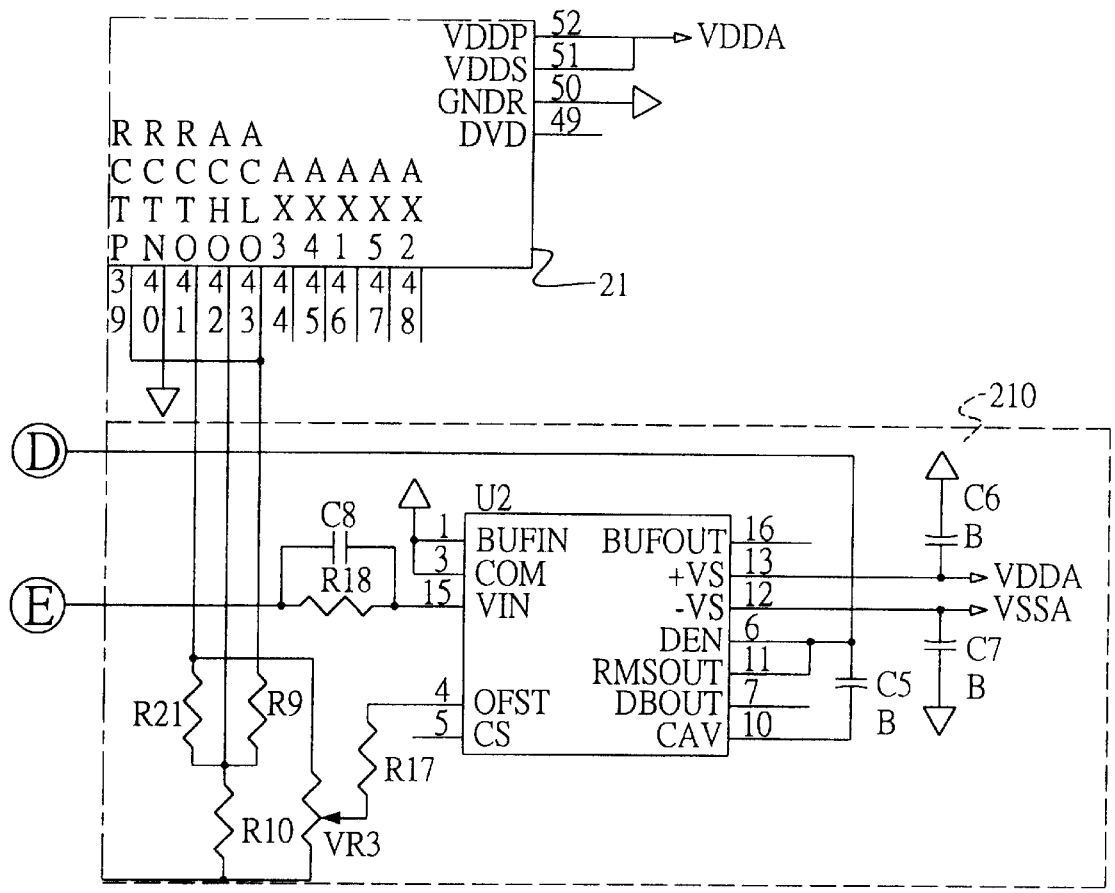

FIG. 2 shows a block diagram of the mentioned internal process unit of the meter (10). The process unit comprises a microprocessor (20), an A/D converter (21) connected to the microprocessor (20) for analog/digital conversion of signals input to the microprocessor (20). A channel selecting unit (22) connected between the A/D converter (21) and the first and second multiple selecting unit (13, 14), controlled by the microprocessor (20). An input of the microprocessor (20) is connected via a plurality of encoders (201,202,203) to the contact points of the function key (12) and the first and second multiple selecting unit (13, 14). An output of the microprocessor (20) is connected with the display (11). In the preferred embodiment, the display (11) is a liquid crystal display.

By operating the first knob (130), the first input channel CH1 is activated by the first multiple selecting unit (13) for selectively carrying out detection of DC/AC voltage, current, resistance, capacity, frequency or polarity measurement of a semi-conductor element. Similarly, by operating the second knob (140), the second input channel CH2 is activated by the second multiple selecting unit (14) for selectively carrying out these measurements.

In operation, the first and second input channels CH1, CH2 are respectively connected with corresponding objects via probes and then measurement functions are selected and sequenced through the first and second multiple selecting units (13, 14). For instance, when the first knob (13) is operated and switched to a position corresponding to a certain measurement function, the first multiple selecting unit (13) will output a signal to the microprocessor (20) for determining the selected function and sequence of the input channel. After determination of the microprocessor (20), the channel selecting unit (22) will be activated to enable the first multiple selecting unit (13) to be connected with the A/D converter (21). In this way, an analog signal input to the first input channel CH1 can be inverted to a digital signal and output to the microprocessor (20). By operating the function key (12), the user can select display or storage of the first measured value. After that, the knob (130) shall be switched to an "OFF" position.

A second measured value generated by the second input channel CH2 can be displayed and/or stored in a way same as the above operation. By selectively operating the function key (12), the first and second measured values can be calculated, for example, to obtain the difference therebetween. The difference can be stored.

From the above description, the structure and operation of the internal processor unit of the meter (10) of the present invention can be readily understood. Now the detail circuit of the processor unit is to be described in detail with reference to FIGS. 3A to 3G.

In FIGS. 3A to 3G, it is shown that the microprocessor (20) is composed by a processing integrate circuit numbered 16C924. The output pins RD0/SEG00–RD7/SEG28 are individually connected to the display (11) (not shown) and the input pins RB0–RB7 are individually connected with the A/D converter (21) to receive output signals and exchange the read and write instructions. Additionally, the input pins RA0–RA5 are individually connected to the encoder 201–203 and then to the first multiple selecting unit (13), the second multiple selecting unit (14) and the function key (12). The input pins RC0–RC2 are individually connected with the channel selecting unit (22) to control the switching of the input channels CH1, CH2.

FIGS. 4A to 4D shows the detail circuit of the A/D converter (21), the channel selecting unit (22) and the first and second multiple selecting unit (13,14), wherein, the A/D converter (21) is formed by an integrated circuit numbered FS970X. An AC/DC voltage converter (210) (RMS/DC) is connected with the A/D converter (21) to transfer the AC signals output by the first and second input channels CH1, CH2 to DC signals. Then the DC signals will be transferred to digital signals by the A/D converter (21).

As mentioned in the above paragraph, the first and second multiple selecting units (13, 14) are respectively connected with the first and second knobs (130, 140) via a plurality of contact points A1, A1'–A8' and B1, B1'–B8' in order to form different circuits corresponding to each measurement function. For details, please refer to each closed loop formed by these contact points as shown in FIGS. 4A to 4D.

In addition, the first and second multiple selecting units (13, 14) include a plurality of protection units (131, 132, 133) and (141, 142, 143) respectively connected to each corresponding contact point A1, A1'–A8, A8' and B1, B1'–B4, B4' in order to prevent the processing unit from being damaged by large voltage and large current. The protection units (131, 141) are formed by posistors and the protection units (132, 133, 142, 143 are individually formed by a pair of grounded transistors Q1–Q2, Q3–Q4, Q5–Q6 and Q7–Q8. If there is large current output from the first and second input channel CH1, CH2, the protection units (131, 132, 133; 141, 142, 143) corresponding thereto will be grounded to isolate the large current and avoid damage to the processing unit.

The channel selecting unit (22) of the processing unit is composed by a pair of electrical switches U1A, U1B numbered 4053 which are connected between the first and second multiple selecting units (13, 14 )and the A/D converter (21) and controlled by the pins CH-SEL of the microprocessor (20).

Figure 5:
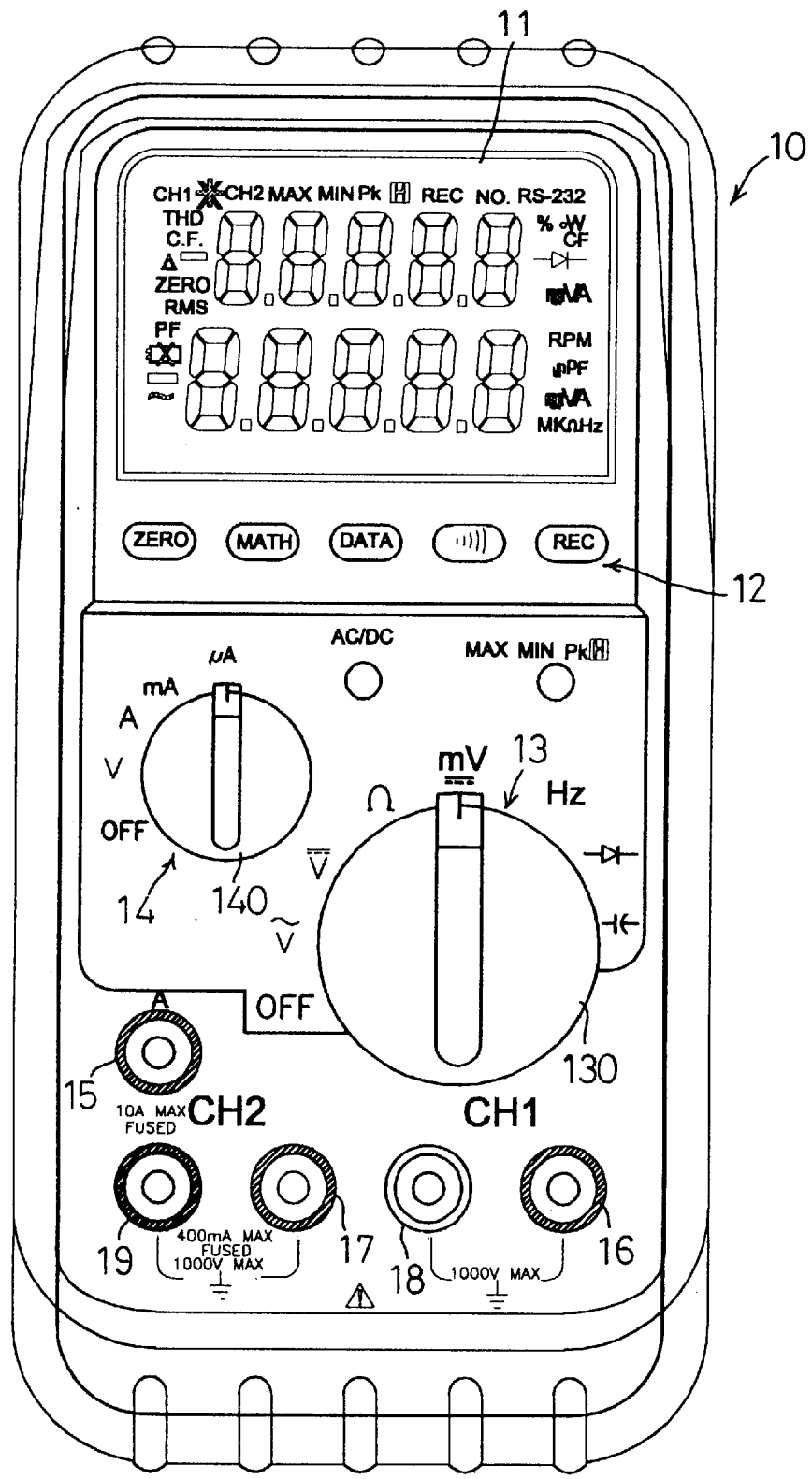
FIG. 5 is a perspective view of a second preferred embodiment of the meter of the present invention.
Figure 6:
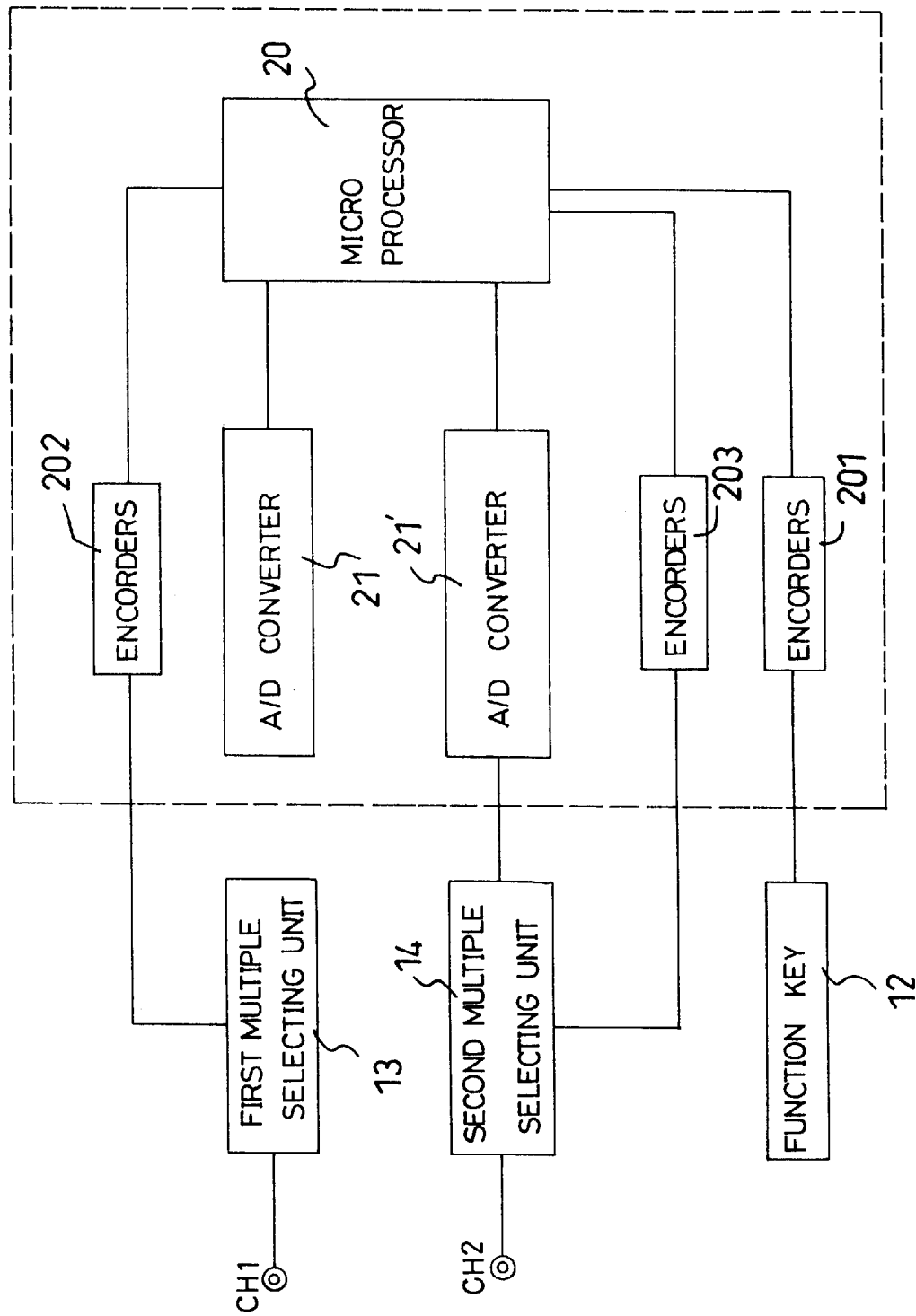
FIG. 6 is a block diagram of the second embodiment of FIG. 5, showing the structure of a processing unit of the meter.

Alternatively, a second preferred embodiment of the meter (10) of the present invention is configured as shown in FIG. 5. The second preferred embodiment has a basic structure similar to the first preferred embodiment, except that there are two independent negative probe sockets (18, 19) respectively cooperated with the two positive probe sockets (16, 17). The first input channel CH1 and the second input channel CH2 respectively have independent reference voltage. To meet the arrangement, the internal processing unit of the meter (10) is modified accordingly. Referring to FIG. 6, the first and second multiple selecting units (13, 14) are respectively connected with a first A/D converter (21) and a second A/D converter (21'). The first and second A/D converters (21) are commonly connected to the microprocessor (20). According to the output signals from the first and second multiple selecting units (13, 14), the microprocessor (20) determines the sequence to process the output signals from the first and second A/D converters (21, 21').

From the above, it is understood that the meter (10) in accordance with the present invention is able not only to display two sets of measured values, but also to calculate the measured values in the case of two objects to be measured. Convenient electrical measurement can be attained without removal of the probes and change of these objects.

It also will be readily understood by those persons skilled in the art that the above examples and embodiments are exemplary only, the invention being defined solely by the attached claims.

What is claimed is:

1. A multifunctional meter with dual input channels, comprising:

a display disposed on a panel;

a function key arranged on the panel for a user to select and set various functions;

a first multiple selecting unit and a second multiple selecting unit respectively connected and controlled by a first knob and a second knob through a plurality of contact points within the meter;

a large-current probe socket; a pair of positive probe sockets and a negative (ground) probe socket respectively arranged on the meter, said negative probe socket being commonly used with the pair of positive probe sockets, a first of said positive probe sockets and the negative probe socket forming a first input channel and a second of said positive probe sockets and the negative probe socket forming a second input channel, said first and second input channels respectively connected to the first multiple selecting unit and the second multiple selecting unit, wherein said first input channel is activated by the first multiple selecting unit by operating the first knob to selectively carry out detection of DC/AC voltage, current, resistance, capacity, frequency or polarity measurement of semi-conductor element, and said second input channel is activated by the second multiple selecting unit by operating the second knob to selectively carry out detection of DC/AC voltage, current, resistance, capacity, frequency or polarity measurement of semi-conductor element; and a processing unit within the meter, connected to the display, the function key, and the first and second multiple selecting units, wherein said processing unit includes at least:

a microprocessor;

an A/D converter connected to the microprocessor for analog/digital conversion of signals input to the microprocessor;

a channel selecting unit formed by a pair of electrical switches respectively connected between the A/D converter and the first and second multiple selecting units, and controlled by the microprocessor, wherein an input of the microprocessor is connected via an encoder to the contact points of the function key and the first and second multiple selecting units, and an output of the microprocessor is connected to the display.

2. The multifunctional meter as claimed in claim 1, wherein said function key at least includes a zero key (ZERO), a mathematic key (MATH), a data key (DATA), an alarm key (ALARM), a record key (REC), a key for switching AC/DC (AC/DC) and a key for locking maximum and minimum values (MAX/MIN PK).

3. The multifunctional meter as claimed in claim 1, wherein said first and second multiple selecting units further have a plurality of protection units connected between respective contact points and the ground.

4. The multifunctional meter as claimed in claim 3, wherein said protection units are formed by posistors.

5. The multifunctional meter as claimed in claim 3, wherein said protection units are formed by two sets of grounded transistors.

6. A multifunctional meter with dual input channels, comprising:

a display disposed on a panel;

a function key arranged on the panel for a user to select and set various functions;

a first multiple selecting unit and a second multiple selecting unit respectively connected to and controlled by a first knob and a second knob through a plurality of contact points within the meter, wherein said first and second multiple selecting units further have a plurality of protection units connected between respective contact points and the ground;

a large-current probe socket, a pair of positive probe sockets, a first and a second negative (ground) probe socket respectively arranged on the meter, a first of said positive probe sockets and the first negative probe socket forming a first input channel, the second said positive probe socket and the second negative probe socket forming a second input channel, said first and second input channels respectively connected with the first multiple selecting unit and the second multiple selecting unit, wherein said first input channel is activated by the first multiple selecting unit by operating the first knob to selectively carry out detection of DC/AC voltage, current, resistance, capacity, frequency or polarity measurement of a semi-conductor element, and said second input channel is activated by the second multiple selecting unit by operating the second knob to selectively carry out detection of DC/AC voltage, current, resistance, capacity, frequency or polarity measurement of the semi-conductor element; and a processing unit within the meter, connected to the display, the function key and the first and second multiple selecting units, wherein said processing unit includes at least:

a microprocessor having an input connected via an encoder to the contact points of the function key and the first and second multiple selecting units, and having an output connected to the display;

an A/D converter connected to the microprocessor for analog/digital conversion of signals input to the microprocessor.

7. The multifunctional meter as claimed in claim 6, wherein said function key at least includes a zero key (ZERO), a mathematics key (MATH), a data key (DATA), an alarm key (ALARM), a record key (REC), a key for switching AC/DC (AC/DC) and a key for locking maximum and minimum values (MAX/MIN PK).

8. The multifunctional meter as claimed in claim 6, wherein said protection units are formed by posistors.

9. The multifunctional meter as claimed in claim 6, wherein said protection units are formed by two sets of grounded transistors.

* * * * *